United States Patent [19]

Kubo

[11] Patent Number: 5,199,890
[45] Date of Patent: Apr. 6, 1993

[54] IC SOCKET

[75] Inventor: Masaaki Kubo, Tokyo, Japan

[73] Assignee: Yamaichi Electric Co., Ltd., Tokyo, Japan

[21] Appl. No.: 897,449

[22] Filed: Jun. 10, 1992

[51] Int. Cl.$^5$ ............................................. H01R 9/09
[52] U.S. Cl. ...................................... 439/72; 439/70; 439/330; 439/526
[58] Field of Search ................................ 439/68–70, 439/72, 264, 330, 331, 525, 526, 73

[56] References Cited

U.S. PATENT DOCUMENTS

| | | | |
|---|---|---|---|
| 4,750,890 | 6/1988 | Dube et al. | 439/330 |
| 4,758,176 | 7/1988 | Abe et al. | 439/72 |
| 4,799,892 | 1/1989 | Hargreaves | 439/72 |
| 4,824,389 | 4/1989 | Doyle et al. | 439/72 |
| 4,984,991 | 1/1991 | Nishimoto | 439/72 |
| 5,076,798 | 12/1991 | Uratsuji | 439/73 |
| 5,106,309 | 4/1992 | Matsuoka et al. | 439/526 |
| 5,154,619 | 10/1992 | Matsuoka | 439/72 |

FOREIGN PATENT DOCUMENTS

62-40366 10/1987 Japan.

*Primary Examiner*—Paula A. Bradley
*Attorney, Agent, or Firm*—Wenderoth, Lind & Ponack

[57] ABSTRACT

A pivot shaft member 8 is disposed at a central portion of an IC platform 2, and a pivotal operation portion disposed at a head portion of the shaft member 8 is exposed on an upper surface side of the IC platform 2. The shaft member 8 and the IC platform 2 or a socket board 1 are connected with each other by cam means. The IC platform 2 is guided between a higher position and a lower position by a pivotal operation of the pivot shaft member 8 in order to adjust an IC supporting height.

4 Claims, 7 Drawing Sheets

IC SOCKET

BACKGROUND OF THE INVENTION

This invention relates to an IC socket provided with an IC platform, in which IC supporting height of the IC platform can be adjusted.

In Japanese Utility Model Publication No. Sho 62-40366 owned by the present applicant, there is disclosed an IC socket, in which a slide bar is allowed to penetrate the socket body from its one side to the other side, and a step is formed on a lower surface of the slide bar, and the slide bar is slid in a lateral direction, with leg portions of an IC platform held in engagement with this stepped surface, in order to guide the leg portions into a higher position or into a lower position in order to adjust an IC supporting height of the IC platform. The arrangement being such that this conventional IC socket can be applied to various IC (integrated circuits) having different levels of height.

However, the above prior art has the following problems. When the slide bar is slid in the lateral direction, its one end portion projects from the side face of a socket board, and as a result a dead space is formed. Since it is practically impossible to arrange contacts in an area where the slide bar extends, this device cannot be applied to a socket which has contacts arranged along four sides of the IC platform.

The prior art also has the following problems. Since one end portion of the slide bar is allowed to project from the side face of the IC socket in order to facilitate a sliding operation on its side face, in the case where IC sockets are mounted in high density on a wiring board, a sufficient operating space cannot be obtained between adjacent IC sockets, and the sliding operation is interrupted. This also prevents IC sockets from being mounted in high density.

SUMMARY OF THE INVENTION

It is therefore an object of the present invention to provide, in order to solve the above problems, an IC socket, in which merely by effecting a pivotal operation of a head portion of a pivot shaft member penetrating a central portion of an IC platform, both an upward and downward movement and an adjustment of height of the IC platform can be effected with ease.

In order to achieve the above object, according to one aspect of the present invention, a pivot shaft member is allowed to penetrate a central portion of the IC platform. A pivotal operation portion formed on a head portion of the pivot shaft member is exposed on an upper surface side of the IC platform. A lower end portion of the shaft member is pivotably supported on the socket board portion right under the IC platform. The pivot shaft member is brought into connection with the IC platform through cam means adapted to guide the IC platform between a higher position and a lower position in accordance with a pivotal operation of the pivot shaft member, thereby adjusting an IC supporting height of the IC platform.

According to another aspect of the present invention, a pivot shaft member is allowed to penetrate a central portion of the IC platform. A pivotal operation portion formed on a head portion of the pivot shaft member is exposed on an upper surface side of the IC platform. The head portion of the shaft member is in engagement with the IC platform such that the IC platform is moved upward and downward following a movement of the pivot shaft member. The lower end portion of the pivot shaft member is brought into connection with the socket board portion right under the IC platform through cam means adapted to guide the IC platform between a higher position and a lower position in accordance with a pivotal operation of the pivot shaft member, thereby adjusting an IC supporting height of the IC platform.

The head portion of the pivot shaft member may be accommodated in an accommodation opening formed in the central portion of the IC platform.

Since the IC socket of the present invention is constituted such as mentioned above, by effecting, in a central portion of the IC platform, a pivotal operation of a head portion of a pivot shaft member exposed at the central portion, an upward and downward movement of the IC platform between a higher position and a lower position can be effected with ease, and an adjusting operation of IC supporting height of the platform can be effected with ease.

Furthermore, since the pivot shaft member is acted to a fixed position in the central portion of the IC platform, the IC platform can be moved upward and downward stably and without any one-sided force exerted thereto.

DETAILED DESCRIPTION OF THE EMBODIMENTS

Several embodiments of the present invention will now be described with reference to the accompanying drawings. The numeral 1 denotes a socket board, which is provided at a generally central portion thereof with a vertically reciprocally movable IC platform 2. A plurality of contacts 3 are arrayed or arranged on a socket board portion, around the IC platform 2. In order to keep a relative position between contact ends 3a of the contacts 3 and the platform 2, the contact ends 3a are inserted into spaces formed between adjacent comb-teeth-like positioning elements 4 which are arranged at a peripheral edge of the IC platform 2.

The IC platform 2 is biased upward and resiliently held by springs 5 disposed between the socket board 1 and the IC platform 2. An IC is carried or supported on the IC platform 2. By pushing down the platform 2 against the springs 5, with leads projecting from sides or side faces of the IC being held in contact with the contact ends 3a of the contacts 3, the contact ends 3a are pushed down, and a contact pressure is obtained by their resilient or elastic restoring force.

As means for pushing down the platform 2, a presser cover 6 is pivotally attached to, for example, one end of the socket board 1, and by closing or shutting the cover 6 onto the socket board 1, the contact ends 3a of the contacts 3 are urged against the IC leads by the cover 6.

Figure 4A:
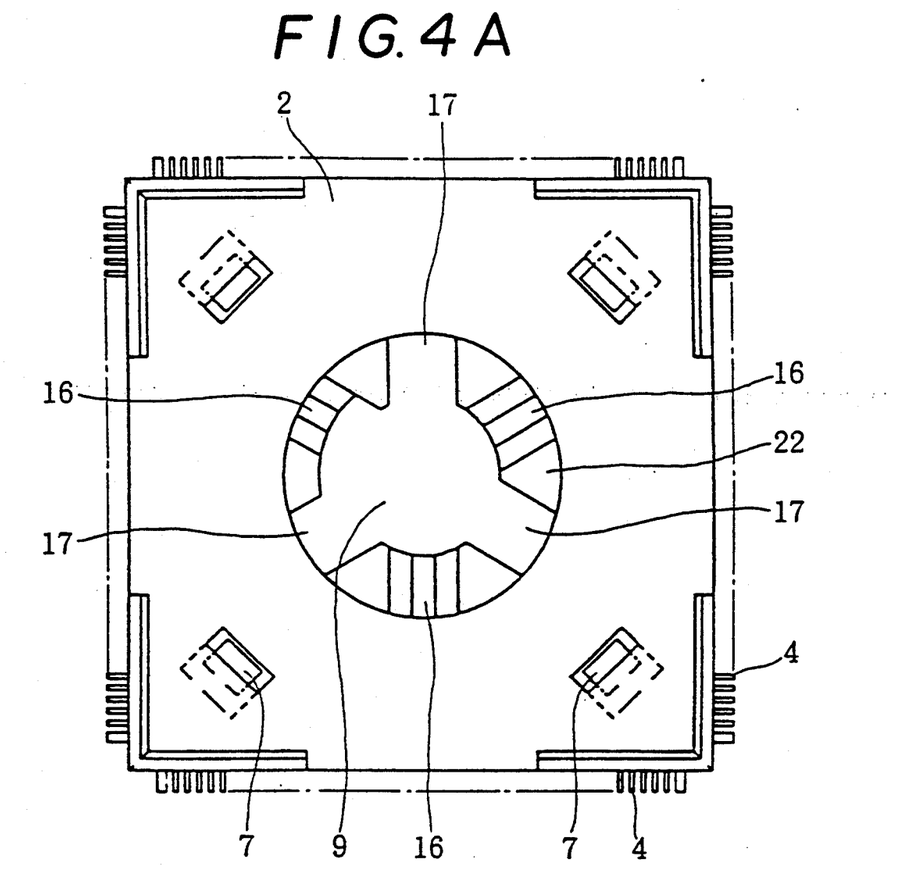
FIG. 4(A) is a plan view of the IC platform in the above socket.
Figure 4B:
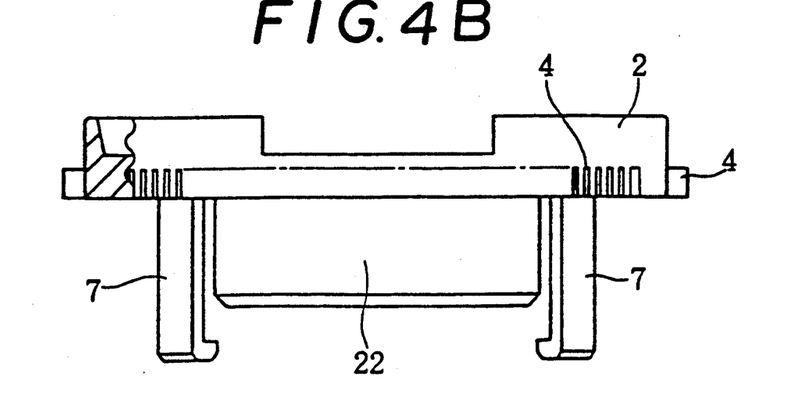
FIG. 4(B) is a partly cutaway sectional view of the above.

As means for preventing the IC platform 2 from escaping upwardly, the platform 2 is provided with leg portions 7 as shown in FIGS. 4(A) and 4(B). The leg portions 7 are inserted into holes formed in the socket board 1 by a known method, not shown, in order to guide the upward and downward movement of the platform 2, and the upward movement of the platform 2 is stopped in position where claws on foremost ends of the leg portions 7 are retained by a stepped portion formed in the wall of a hole.

Figure 1:
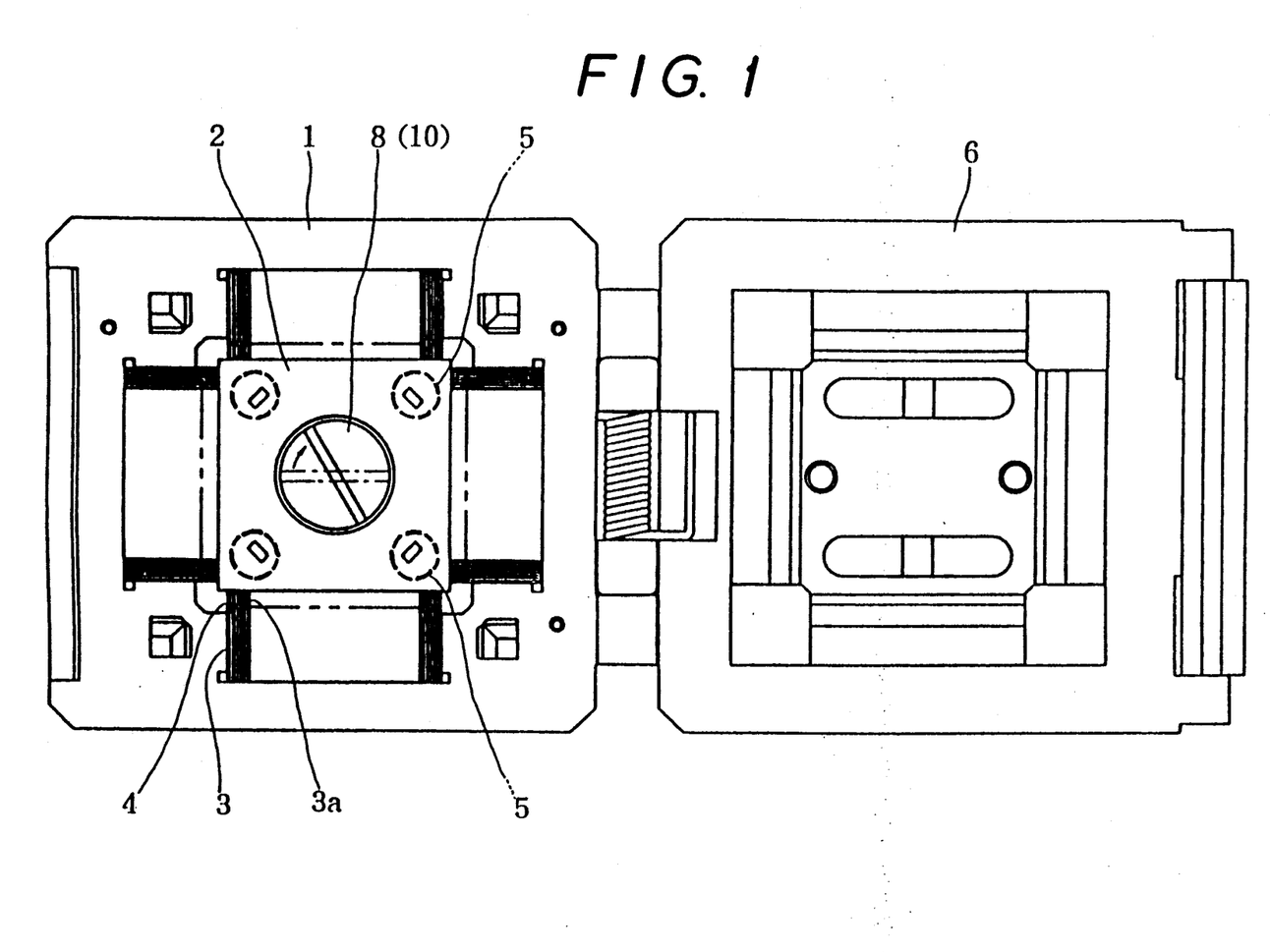
FIG. 1 is a plan view of an IC socket according to one embodiment of the present invention.
Figure 2A:
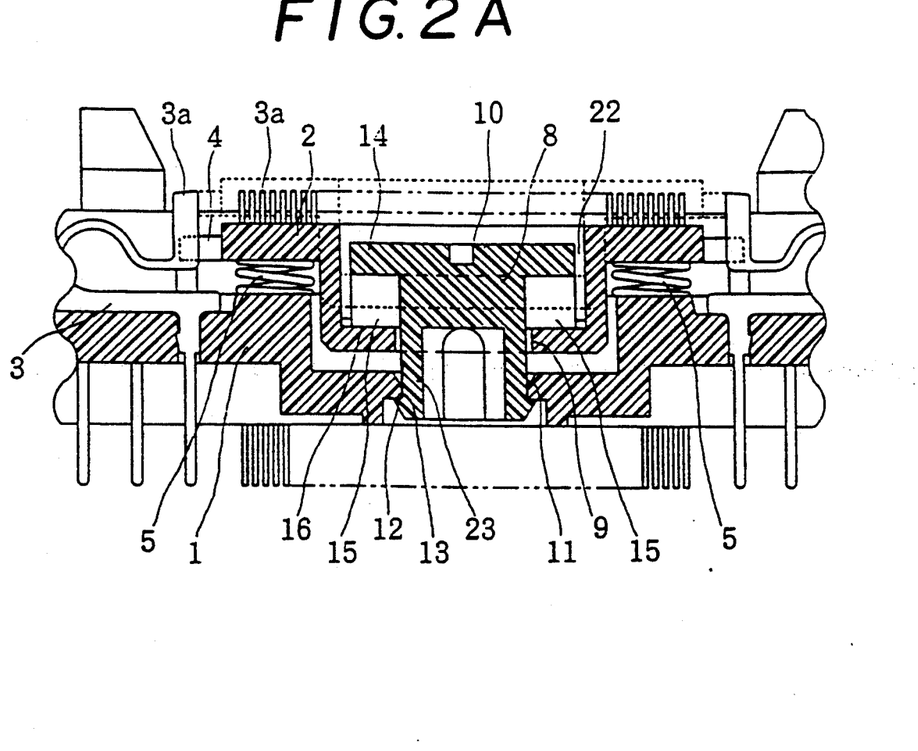
FIG. 2(A) is a sectional view of an important portion of the above, in which an IC platform is now in its lower position.
Figure 3A:
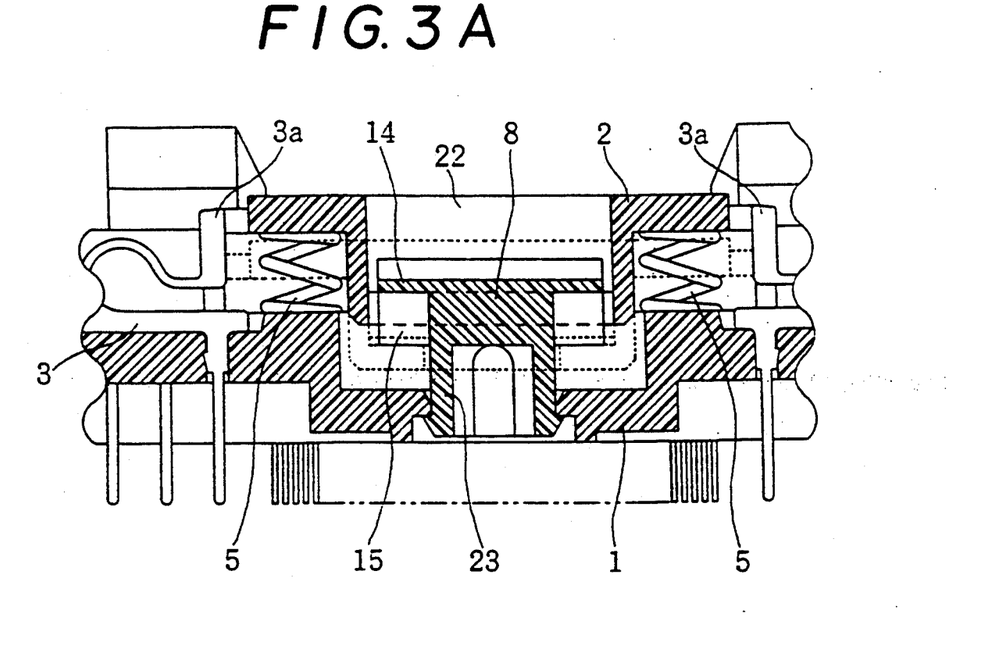
FIG. 3(A) is a sectional view of an important portion of the IC socket, in which the IC platform is now in its higher position.

As shown in FIGS. 2(A) and 3(A), a pivot shaft portion 8 is allowed to penetrate a central portion of the IC platform 2, and a lower end of the pivot shaft member 8 is pivotably supported on the socket board portion right under the platform 2.

More specifically, FIGS. 2(A) and 3(A) show one embodiment of the present invention. As illustrated, a shaft hole 9 is formed throughout a central portion of the IC platform 2, and the pivot shaft member 8 is allowed to penetrate the shaft hole 9. A pivotal operation portion 10 adapted to engage with a tip of a tool is formed on a head portion of the pivot shaft member 8 such that the pivotal operation portion 10 is exposed on an upper surface side of the IC platform 2. The lower end portion of the shaft member 8 is inserted into a shaft hole 11 formed in the socket board right under the platform 2 in order to guide the vertical movement (upward and downward movement) and the pivotal movement. Furthermore, retaining claws 12 formed on the lower end portion of the pivot shaft member 8 are brought into engagement with a stepped portion 13 formed in the shaft hole 11 in order to prevent the IC platform 2 from escaping upwardly and also to support the same pivotably.

An accommodation opening 22 is formed in a central portion of the upper surface of the IC platform 2, and the shaft hole 9 is formed in a bottom wall of the accommodation opening 22. The pivot shaft member 8 is allowed to penetrate the shaft hole 9, and the head portion of the pivot shaft member 8 is accommodated within the accommodation opening 22 in order to prevent any possible interference between the pivot shaft member 8 and the IC.

The pivot shaft member 8 and the IC platform 2 are connected with each other through a cam means adapted to guide the IC platform 2 between a higher position and a lower position by a pivotal operation of the pivot shaft member 8.

Figure 5A:
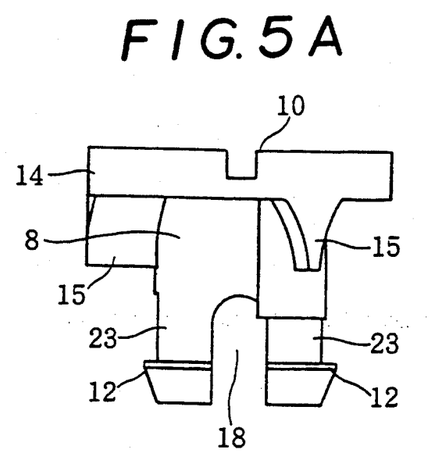
FIG. 5(A) is a side view of a pivot shaft member in the above socket.
Figure 5B:
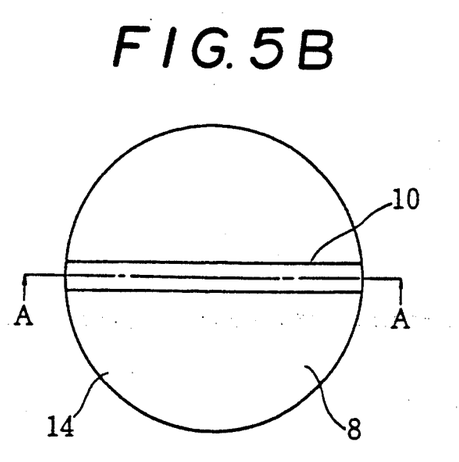
FIG. 5(B) is a plan view of the above.
Figure 5C:
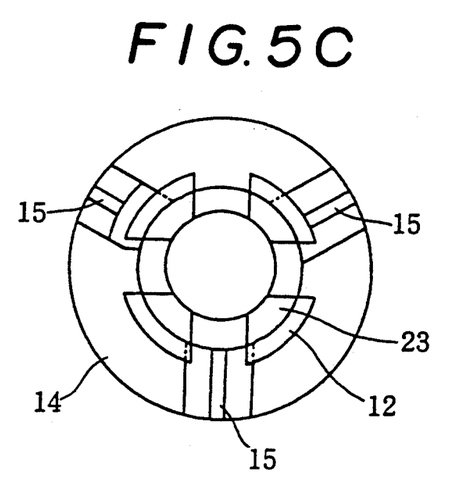
FIG. 5(C) is a bottom view of the above.
Figure 5D:
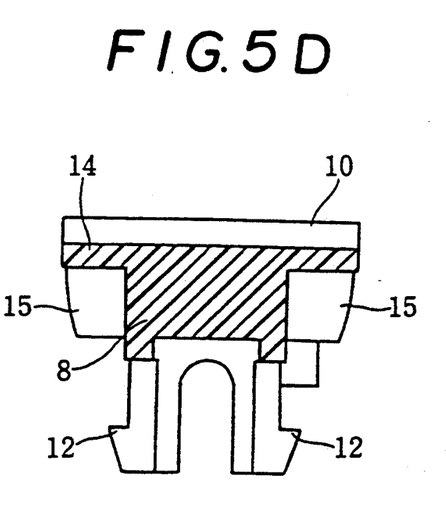
FIG. 5(D) is a sectional view taken on line A—A of FIG. 5(B)

As one example, a flange portion 14 is disposed at the head portion (that is, pivotal operation portion 10) of the pivot shaft member 8 which is exposed on the upper surface side of the IC platform 2, and a slider 15 projects downward from a lower surface of the flange 14 as shown in FIGS. 2(A), 3(A) and 5(A). On the other hand, as shown in FIG. 4(A), a cam face 16 to be pushed down by the slider 15 and a cam bore 17, into which the slider 15 is to be fitted, are formed alternately (i.e., in turn) around the shaft hole 9 (that is, upper surface of the bottom wall of the accommodation opening 22) of the IC platform 2, such that they are in concentric relation with the shaft hole 9.

Figure 2B:
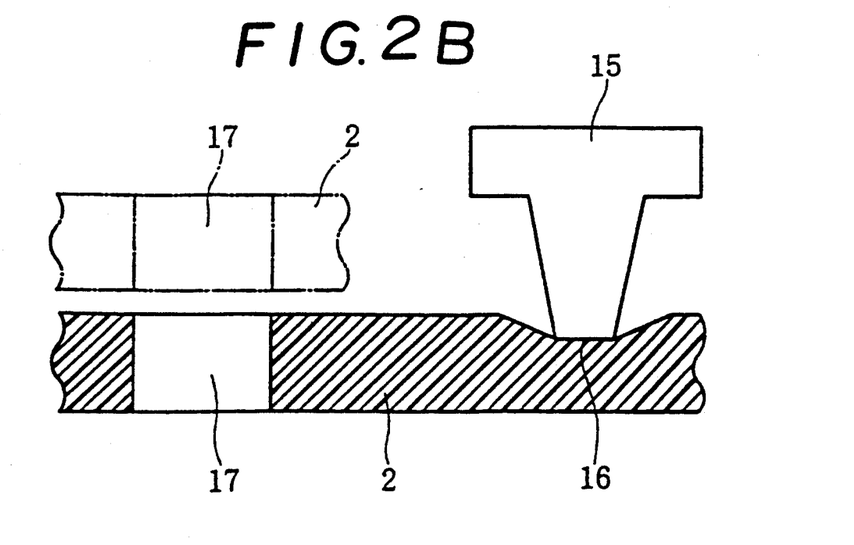
FIG. 2(B) is an expanded sectional view of cam means for realizing the above condition.

As shown in FIGS. 2(A) and 2(B), the tip of the tool is brought into engagement with the operation portion 10. When the pivot shaft portion 8 is pivoted in that condition, the slider 15 is also pivoted and guided by the cam face 16. As a result, the IC platform 2 is pushed down and held in a lower position against the spring 5. By this, the IC supporting height is kept in a lower position in order to make it possible to contact the IC, a projection level of the IC leads of which is high.

Figure 3B:
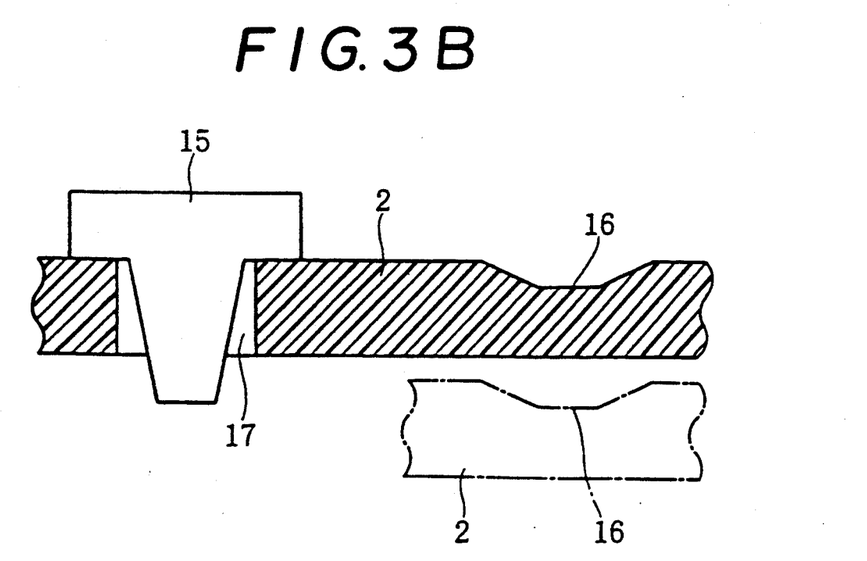
FIG. 3(B) is an expanded sectional view of the cam means for realizing the above condition.

Further, as shown in FIGS. 3(A) and 3(B), the pivot shaft member 8 is pivoted in the same manner as mentioned. When the slider 15 is guided and fitted into the cam bore 17, the IC platform 2 is moved upward by the spring 5, and brought into abutment engagement with the flange 14 so as to be held in a high level. Because the IC platform 2 is held in the high level, the IC supporting height is also held in the high position, thus enabling to contact the IC, the projection level of the IC leads of which is low.

As shown in FIG. 5, split grooves 18 extending in the axial direction and opened up at the end of the pivot shaft member 8 are formed at equal spaces in the peripheral surface of the pivot shaft member 8, and a plurality of engaging legs 23 are formed so that it can be expanded and contracted elastically. The pivot shaft member 8 is inserted, under pressure into the shaft hole 11 in its contracted condition. After inserted, the pivot shaft member 8 is expanded to engage with the stepped portion 13.

Figure 6:
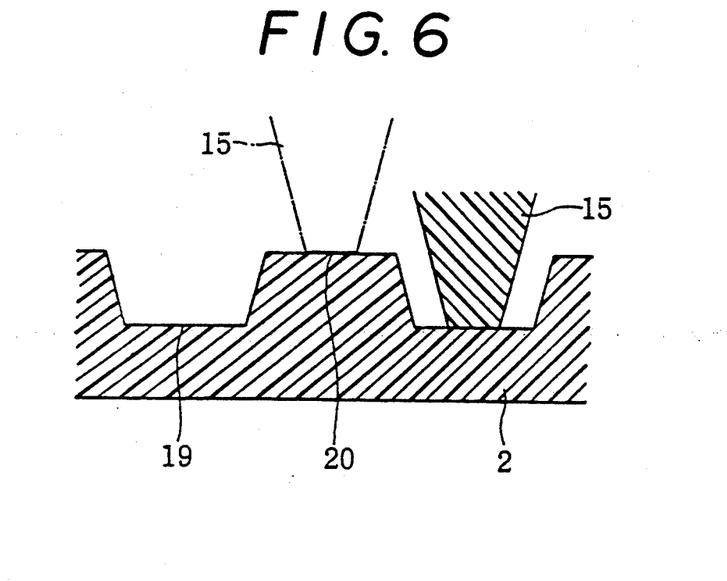
FIG. 6 is an expanded sectional view showing a modified embodiment of the cam means.
Figure 7:
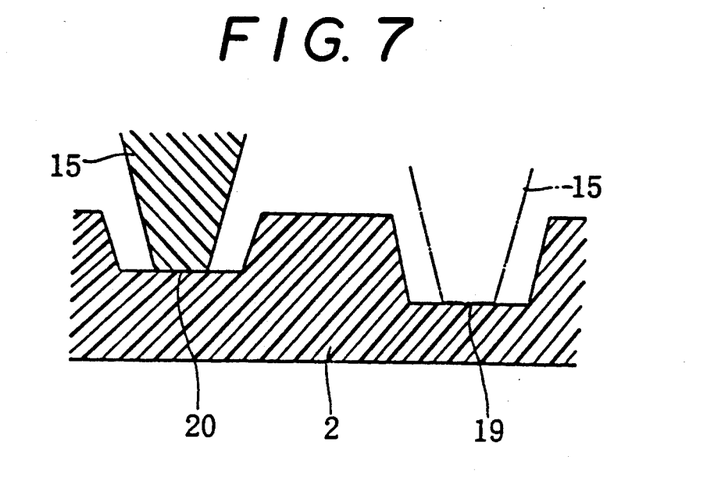
FIG. 7 is likewise an expanded sectional view showing another modified embodiment of the cam means.

In the above embodiment, the cam means guides the IC platform 2 into the higher position with its cam face, and into the lower position with its cam bore 17. However, as shown in the expanded views of FIGS. 6 and 7, it may be designed such that a lower position cam face 19 and a higher position cam face 20 are provided, and the slider 15 is guided to the respective cam faces 19 and 20, and the IC platform 2 is guided between the higher position and the lower position, in accordance with the pivotal movement of the pivot shaft member 8. Of course, a difference of more than two steps may be provided between the cam faces, so that the IC platform 2 can be adjusted between two positions equal to or more than two steps in height.

Figure 8:
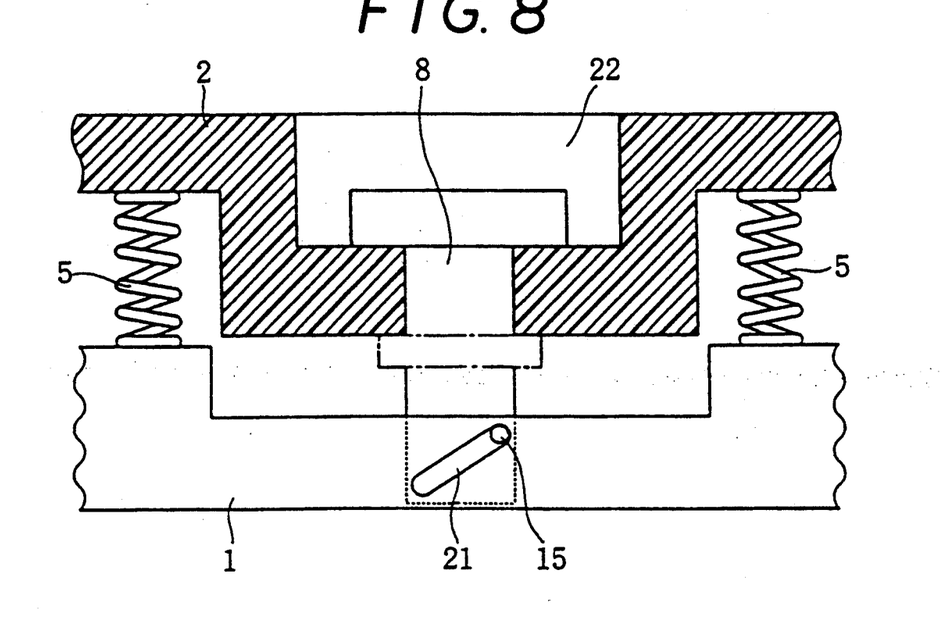
FIG. 8 is a sectional view showing an important portion of an IC socket according to another embodiment of the present invention.

FIG. 8 shows another embodiment. As illustrated, the pivot shaft member 8 is allowed to penetrate the central portion of the IC platform 2, and the head portion of the pivot shaft member 8 is engaged with the peripheral wall of the shaft hole 9, so that the IC platform 2 and the pivot shaft member 8 would move upward and downward. Further, the lower end portion of the shaft member 8 and the socket board right under the IC platform 2 are connected with each other through a cam means for guiding the IC platform 2 between a higher position and a lower position in accordance with an axial movement of the pivot shaft member 8 by a pivotal movement of the pivot shaft member 8.

This cam means is provided with a slant cam groove 21 formed in the peripheral surface of the lower end portion of the pivot shaft member 8 with a twisting angle, and a slider 15 disposed at the inner peripheral surface of the shaft hole 11 is slip fitted into the slant cam groove 21. Alternatively, a slider is disposed at the peripheral surface of the lower end portion of the pivot shaft member 8, and this slider is slip fitted into the slant cam groove 21 formed in the inner peripheral surface of the shaft hole 11, so that the higher position and the lower position of the IC platform 2 can be established by the end portion of the slant cam groove. In this embodiment, the pivot shaft member 8 moved upwardly and downwardly together with the IC platform 2, and the IC supporting heights in the higher position and in the lower position are determined by this cam means.

As shown in FIG. 8, in the case where the head portion of the pivot shaft member 8 is provided with an expanded portion such as the flange 14 in order to prevent the IC platform 2 from escaping upwardly, the IC platform 2 is upwardly biased and resiliently held by the spring 5. In the case where the pivot shaft member 8 and the IC platform 2 are integrally connected with each other as shown by the imaginary lines of FIG. 8, the spring 5 may be omitted.

Figure 9:
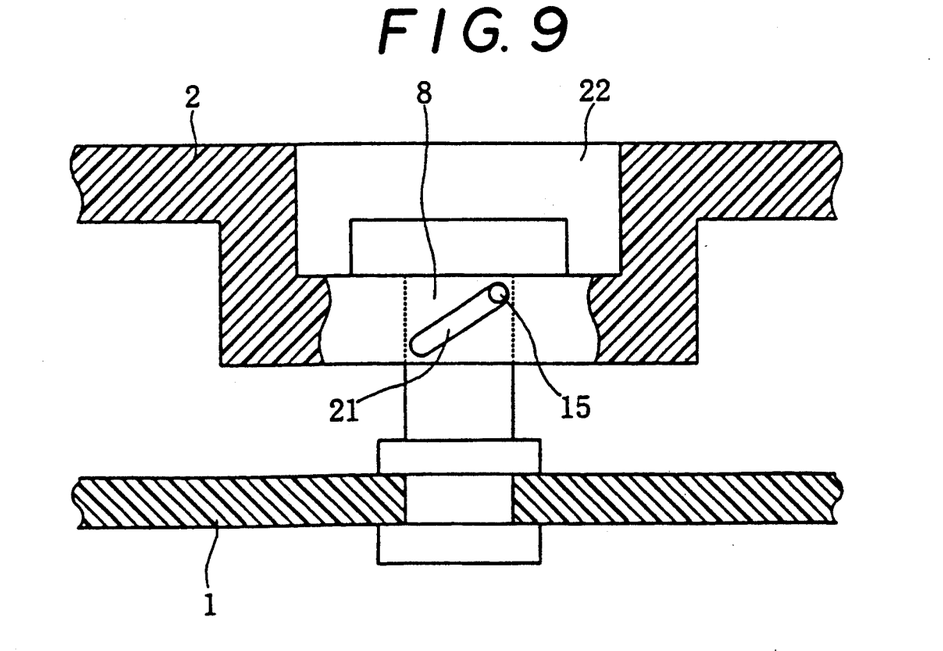
FIG. 9 is likewise a sectional view showing an important portion of an IC socket according to still another embodiment of the present invention.

FIG. 9 shows a further embodiment. In this embodiment, the lower end portion of the pivot shaft member 8 is pivotably supported on the socket board portion right under the IC platform 2, and cam means such as the above slant cam groove is formed between the head portion of the pivot shaft member 8 and the inner peripheral surface of the shaft hole 9 in the central portion of the IC platform 2, thereby adjusting the position of the IC platform 2 between the higher position and the lower position.

Also in this embodiment, in the case where the lower end portion of the pivot shaft member 8 and the shaft hole 11 of the socket board are integrally connected, the spring 5 may be omitted. In the case where the lower end portion of the pivot shaft member 8 is pivotally supported in the shaft hole 11 merely in such a manner as to prevent it from escaping upwardly, it is preferable to provide the spring 5. In the embodiment shown in FIG. 9, as in the embodiment of FIGS. 2(A) and 2(B), the pivot shaft member 8 itself is not moved upwardly and downwardly. Instead, the pivot shaft member 8 is pivoted in a fixed position, and the IC platform 2 is moved upwardly and downwardly alone, guided by the cam means.

According to the present invention, by operating the operation portion of the pivot shaft member exposed at the central portion of the IC platform, the IC supporting height of the IC platform can be adjusted very easily. Moreover, the IC platform can be stably moved upward and downward by the pivot shaft member which is allowed to penetrate the central portion of the IC platform.

Furthermore, since the operation portion of the pivot shaft member is operated at the central portion of the IC platform, the present invention can also be applied properly to an IC socket of the type that contacts are arranged along four sides around the IC platform. In addition, even if the IC socket is disposed proximate to the wiring board, the operation portion of the pivot shaft member can be operated from the upper surface side of the IC platform without any trouble, and therefore the present invention can also cope with high density mounting of the IC sockets effectively.

What is claimed is:

1. An IC socket comprising a socket board, an IC platform disposed on said socket board for movement upward and downward and adapted to carry an IC thereon, and a plurality of contacts arranged in array on said socket board portion around said IC platform, so that leads of said IC carried on said IC platform contact said plurality of contacts, wherein said IC socket further comprises a pivot shaft member allowed to penetrate a central portion of said IC platform, a pivotal operation portion for allowing a tip of a tool to engage therewith, being formed on a head portion of said pivot shaft member such that said pivotal operation portion is exposed on an upper surface side of said IC platform, a lower end portion of said shaft member being pivotably supported on said socket board portion right under said IC platform, said pivot shaft member being brought into connection with said IC platform through cam means adapted to guide said IC platform between a higher position and a lower position in accordance with a pivotal operation of said pivot shaft member, thereby adjusting an IC supporting height of said IC platform.

2. An IC socket as claimed in claim 1, wherein said head portion of said pivot shaft member is accommodated within an accommodation opening formed in said central portion of said IC platform.

3. An IC socket comprising a socket board, an IC platform disposed on said socket board for movement upward and downward and adapted to carry an IC thereon, and a plurality of contacts arranged in array on said socket board portion around said IC platform, so that leads of said IC carried on said IC platform contact said plurality of contacts, wherein said IC socket further comprises a pivot shaft member allowed to penetrate a central portion of said IC platform, a pivotal operation portion for allowing a tip of a tool to engage therewith, being formed on a head portion of said pivot shaft member such that said pivotal operation portion is exposed on an upper surface side of said IC platform, a lower end portion of said shaft member being in engagement with said IC platform such that said pivot shaft member is moved upward and downward following a movement of said IC platform, said lower end portion of said pivot shaft member being brought into connection with said socket board portion right under said IC platform through cam means adapted to guide said IC platform between a higher position and a lower position in accordance with a pivotal operation of said pivot shaft member, thereby adjusting an IC supporting height of said IC platform.

4. An IC socket as claimed in claim 3, wherein said head portion of said pivot shaft member is accommodated within an accommodation opening formed in said central portion of said IC platform.

* * * * *